(12) United States Patent
Nishino et al.

(10) Patent No.: US 7,671,546 B2
(45) Date of Patent: Mar. 2, 2010

(54) VOLTAGE DIVISION RESISTOR FOR ACCELERATION TUBES, ACCELERATION TUBE, AND ACCELERATOR

(75) Inventors: Shigehiro Nishino, Kyoto (JP); Ryoichi Ono, Kyoto (JP)

(73) Assignee: Kyoto Institute of Technology, Kyoto-shi (JP)

( * ) Notice: Subject to any disclaimer, the term of this patent is extended or adjusted under 35 U.S.C. 154(b) by 291 days.

(21) Appl. No.: 11/665,838

(22) PCT Filed: Aug. 25, 2005

(86) PCT No.: PCT/JP2005/015419

§ 371 (c)(1),
(2), (4) Date: Nov. 16, 2007

(87) PCT Pub. No.: WO2006/043366

PCT Pub. Date: Apr. 27, 2006

(65) Prior Publication Data

US 2009/0039804 A1 Feb. 12, 2009

(30) Foreign Application Priority Data

Oct. 20, 2004 (JP) .............................. 2004-305299

(51) Int. Cl.
*H05H 25/00* (2006.01)
(52) U.S. Cl. .................... 315/500; 315/501; 315/506
(58) Field of Classification Search ............. 315/500, 315/85; 327/598–602
See application file for complete search history.

(56) References Cited

U.S. PATENT DOCUMENTS 3,949,265 A * 4/1976 Holl .......................... 315/15

FOREIGN PATENT DOCUMENTS

| JP | 3-84839 | 4/1991 |
| JP | 4-94100 | 3/1992 |

* cited by examiner

*Primary Examiner*—Douglas W Owens
*Assistant Examiner*—Jianzi Chen
(74) *Attorney, Agent, or Firm*—Kratz, Quintos & Hanson, LLP

(57) ABSTRACT

To provide a voltage division resistor for acceleration tube, an acceleration tube, and an accelerator capable of reducing the cost of the acceleration tube and enhancing the operation efficiency. An acceleration tube (1) for accelerating ions (charged particles) I by applying an acceleration voltage V comprises a tubular acceleration tube body (2) made of synthetic resin, a plurality of ring-like acceleration electrodes (3) arranged in a row on the inner circumferential surface (2a) of the acceleration tube body (2) at predetermined intervals in the axial direction of the acceleration tube body (2), a plurality of voltage division resistors (voltage division resistors for the acceleration tube) (5) wound spirally on the outer circumferential surface (2b) of the acceleration tube body (2), and a plurality of terminal bolts (terminal member) (4) provided in close contact with the acceleration tube body (2) while penetrating the acceleration tube body (2) radially and having a forward end (front end) (4a) connected electrically with the acceleration electrodes (3) and a head (rear end) (4b) connected electrically with each connector (connection point) (16) of the voltage division resistor (5).

19 Claims, 10 Drawing Sheets

VOLTAGE DIVISION RESISTOR FOR ACCELERATION TUBES, ACCELERATION TUBE, AND ACCELERATOR

TECHNICAL FIELD

The present invention relates to a voltage division resistor for acceleration tubes for dividing an acceleration voltage for the acceleration tube accelerating a charged particle on the basis of an application of the acceleration voltage, and the acceleration tube provided with the voltage division resistor for the acceleration tube, and an accelerator provided with the acceleration tube.

BACKGROUND ART

As a conventional art of this kind, there has been known a multistage acceleration type charged particle beam generating apparatus in which two adjacent acceleration electrodes are electrically connected by a voltage division resistor for dividing an acceleration voltage applied at a time of accelerating the charged particle within the acceleration tube (for example, refer to patent document 1).

Patent Document 1: Japanese Unexamined Patent Publication No. HEI11-025900 (pages 3 and 4, FIG. 1 etc.)

DISCLOSURE OF THE INVENTION

Problems to be Solved by the Invention

As the voltage division resistor mentioned above, a ceramic resistor is frequently used; however, the ceramic resistor is formed in a fin shape such as a radiator for preventing a creeping discharge and is expensive. Accordingly, there is a problem that the acceleration tube provided with a plurality of ceramic resistors is expensive.

Further, in the case where the acceleration tube is constructed by ceramic, an adsorption gas or a water content contained in the ceramic is discharged in the acceleration tube little by little at a time of setting the inside of the acceleration tube in a high vacuum condition, and it becomes hard to maintain the inside of the acceleration tube in the high vacuum condition. Accordingly, there is a problem that an operation efficiency of the acceleration tube is lowered.

In the case where the acceleration tube is constructed by ceramic or glass, an electric discharge is caused within the acceleration tube by the charged particle at a time of actuating the acceleration tube, that is, a composition of a surface of the ceramic or the glass is decomposed and a surface leak current flows. Accordingly, there is a problem that the acceleration of the charged particle is prevented.

The present invention is made in view of the circumstance and the problem mentioned above, and an object of the present invention is to provide a voltage division resistor for acceleration tube, an acceleration tube, and an accelerator capable of reducing the cost of the acceleration tube and enhancing the operation efficiency.

Means for Solving the Problem

In order to achieve the object mentioned above, according to a first aspect of the present invention, there is provided a voltage division resistor for acceleration tube, the voltage division resistor provided for dividing an acceleration voltage for the acceleration tube accelerating a charged particle by applying the acceleration voltage, wherein a plurality of resistors are connected in series, and the plurality of resistors are covered with an insulating heat shrinkable tube extending in the connecting direction.

According to a second aspect of the present invention, there is provided a voltage division resistor for acceleration tube, wherein a plurality of resistors are coated by an insulating gel, and the plurality of resistors are covered with the insulating heat shrinkable tube via the insulating gel.

According to a third aspect of the present invention, there is provided a voltage division resistor for acceleration tube, wherein a surface of the resistor is not coated by a coating material.

According to a fourth aspect of the present invention, there is provided an acceleration tube accelerating a charged particle by applying an acceleration voltage, the acceleration tube includes a synthetic resin acceleration tube main body formed in a cylindrical shape, a plurality of ring-shaped acceleration electrodes provided in a line in an axial direction of the acceleration tube main body at a predetermined interval with each other on an inner peripheral surface of the acceleration tube main body, a plurality of voltage division resistor for acceleration tube according to any one of the first to third aspects of the present invention that are spirally wound around an outer peripheral surface of the acceleration tube main body, and a plurality of terminal members penetrating in a radial direction of the acceleration tube main body and provided by being closely attached to the acceleration tube main body, and structured such that a front end is electrically connected to the acceleration electrode and a rear end is electrically connected to each of connection points of the voltage division resistor for acceleration tube.

According to a fifth aspect of the present invention, there is provided an acceleration tube, wherein the terminal member is closely attached to the acceleration tube main body via a sealing adhesive agent.

According to a sixth aspect of the present invention, there is provided an acceleration tube, wherein a spring member is interposed between the acceleration electrode and the terminal member.

According to a seventh aspect of the present invention, there is provided an acceleration tube, wherein a spacer is interposed between the spring member and the acceleration electrode.

According to an eighth aspect of the present invention, there is provided an acceleration tube, wherein the plurality of voltage division resistors for acceleration tube are accommodated within a filling groove formed such that it extends spirally on an outer peripheral surface of the acceleration tube main body, and an insulating gel is filled within the filling groove.

According to a ninth aspect of the present invention, there is provided an acceleration tube, wherein an outer peripheral surface of the acceleration tube main body is covered with an insulating cover.

Further, according to a tenth aspect of the present invention, there is provided an accelerator including the acceleration tube according to any one of the fourth to ninth aspects of the present invention.

EFFECT OF THE INVENTION

According to the first aspect of the present invention, since the structure itself is compact and inexpensive, it is possible to downsize the acceleration tube, thereby achieving a cost reduction. Further, since the plurality of resistors are covered with the insulating heat shrinkable tube, it is possible to prevent the surface leak current from flowing through the surface of the resistor.

According to the second aspect of the present invention, it is possible to more effectively prevent the surface leak current from flowing through the surface of the resistor, than in the first aspect of the present invention.

According to the third aspect of the present invention, it is possible to more securely prevent the surface leak current from flowing through the surface of the resistor, than in the structure in which the coating material is coated on the surface.

According to the fourth and tenth aspects of the present invention, since the voltage division resistor for acceleration tube is compact and inexpensive, and can be downsized by being integrally formed with the cylindrical acceleration tube main body, and the acceleration tube main body made of synthetic resin is inexpensive, it is possible to achieve a cost reduction. Further, since the acceleration tube main body is made of synthetic resin, and has a high insulating property, it is possible to shorten the length to about two thirds of the conventional acceleration tube main body made of ceramic. Further, since the adsorption gas or the water content is not discharged in the internal space of the acceleration tube main body or the surface leak current does not flow, even when the internal space is set to a high vacuum condition, it is unnecessary to clean the acceleration tube main body, and a service life of the acceleration tube main body is long. In addition, since the voltage division resistor for acceleration tube is equipped, it is possible to obtain an excellent insulating effect, and it is possible to prevent the surface leak current from flowing. Accordingly, it is possible to improve an operation efficiency of the acceleration tube.

According to the fifth and tenth aspects of the present invention, it is possible to more securely seal between the acceleration tube main body and the terminal member.

According to the sixth and tenth aspects of the present invention, since the spring member is energized in such a manner as to be brought into pressure contact with the outer peripheral surface of the acceleration electrode, it is possible to firmly support the acceleration electrode.

According to the seventh and tenth aspects of the present invention, since a smaller spring member can be used, it is possible to achieve a cost reduction.

According to the eighth and tenth aspects of the present invention, it is possible to downsize the acceleration tube, and it is also possible to more effectively prevent the surface leak current from flowing on the surface of the voltage division resistor for acceleration tube.

According to the ninth and tenth aspects of the present invention, since the whole of the acceleration tube can be shielded from a high voltage, it is possible to keep a user safe.

BEST MODE FOR CARRYING OUT THE INVENTION

A description will be given below of an embodiment according to the present invention with reference to the accompanying drawings.

An acceleration tube 1 according to the present embodiment, as shown in FIGS. 1 to 6, is for accelerating an ion (a charged particle) I by applying an acceleration voltage V, and is provided with an acceleration tube main body 2, a plurality of acceleration electrodes 3, a plurality of terminal bolts (terminal members) 4, and a plurality of voltage-division resistors (voltage division resistors for acceleration tube) 5.

Figure 1:
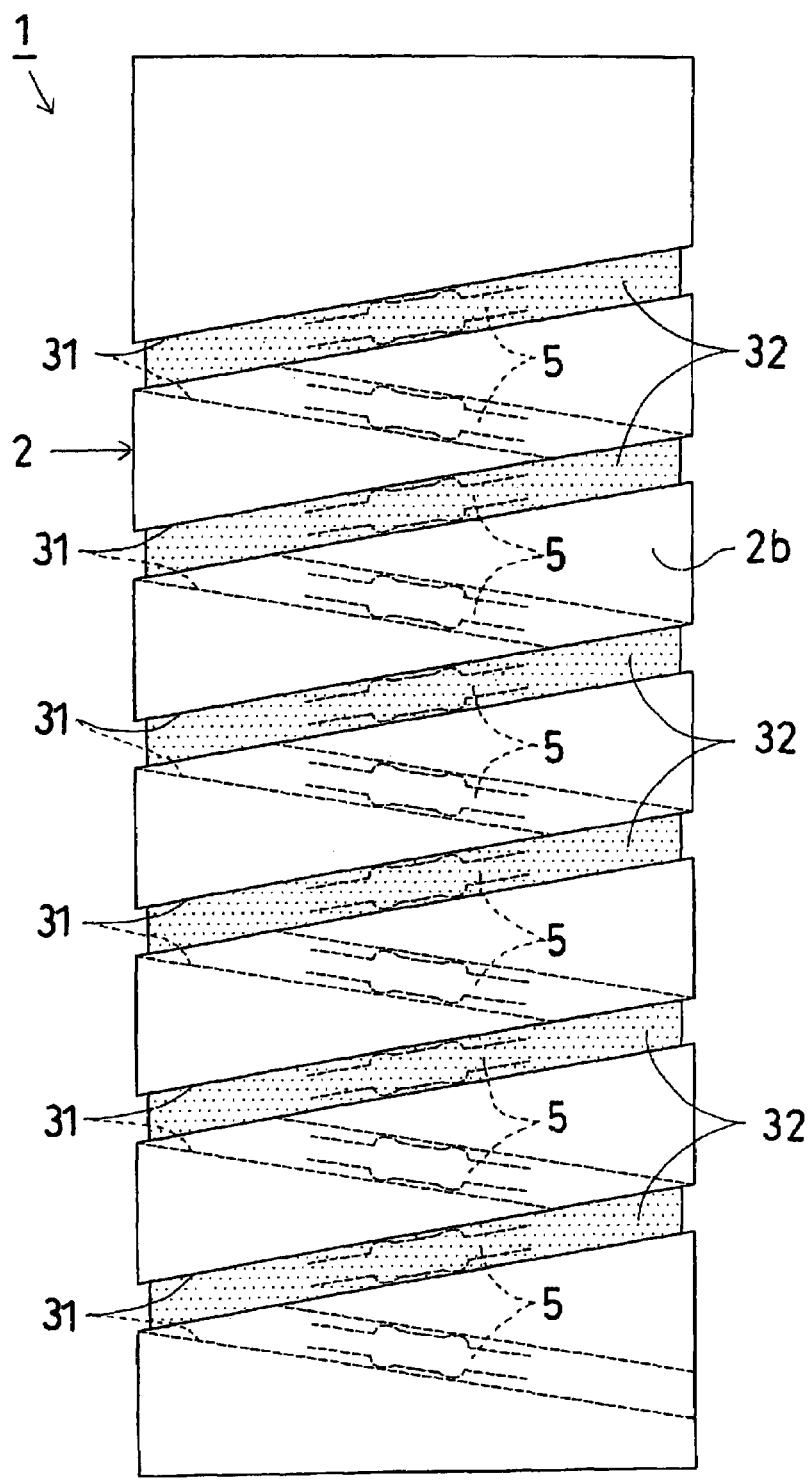
FIG. 1 is a front view of an acceleration tube according to an embodiment of the present invention.
Figure 2:
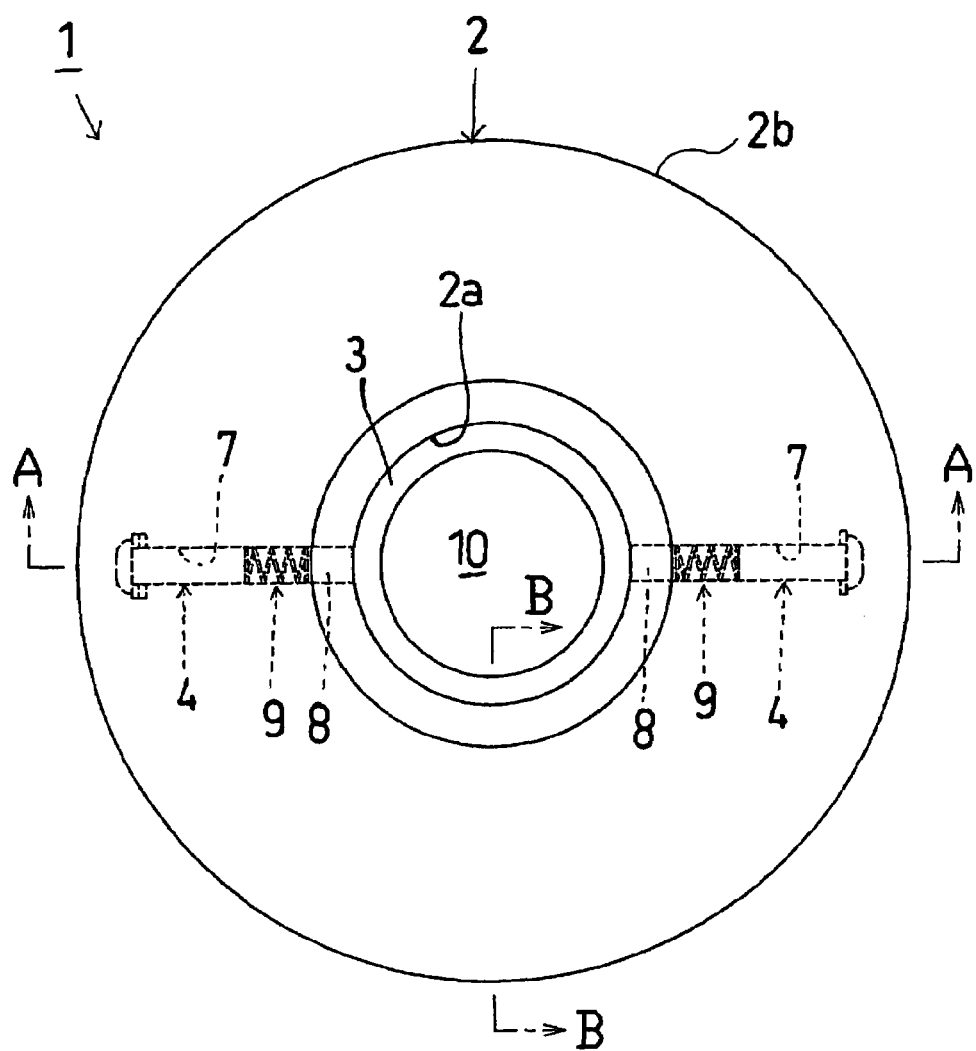
FIG. 2 is a plan view of the acceleration tube.
Figure 3:
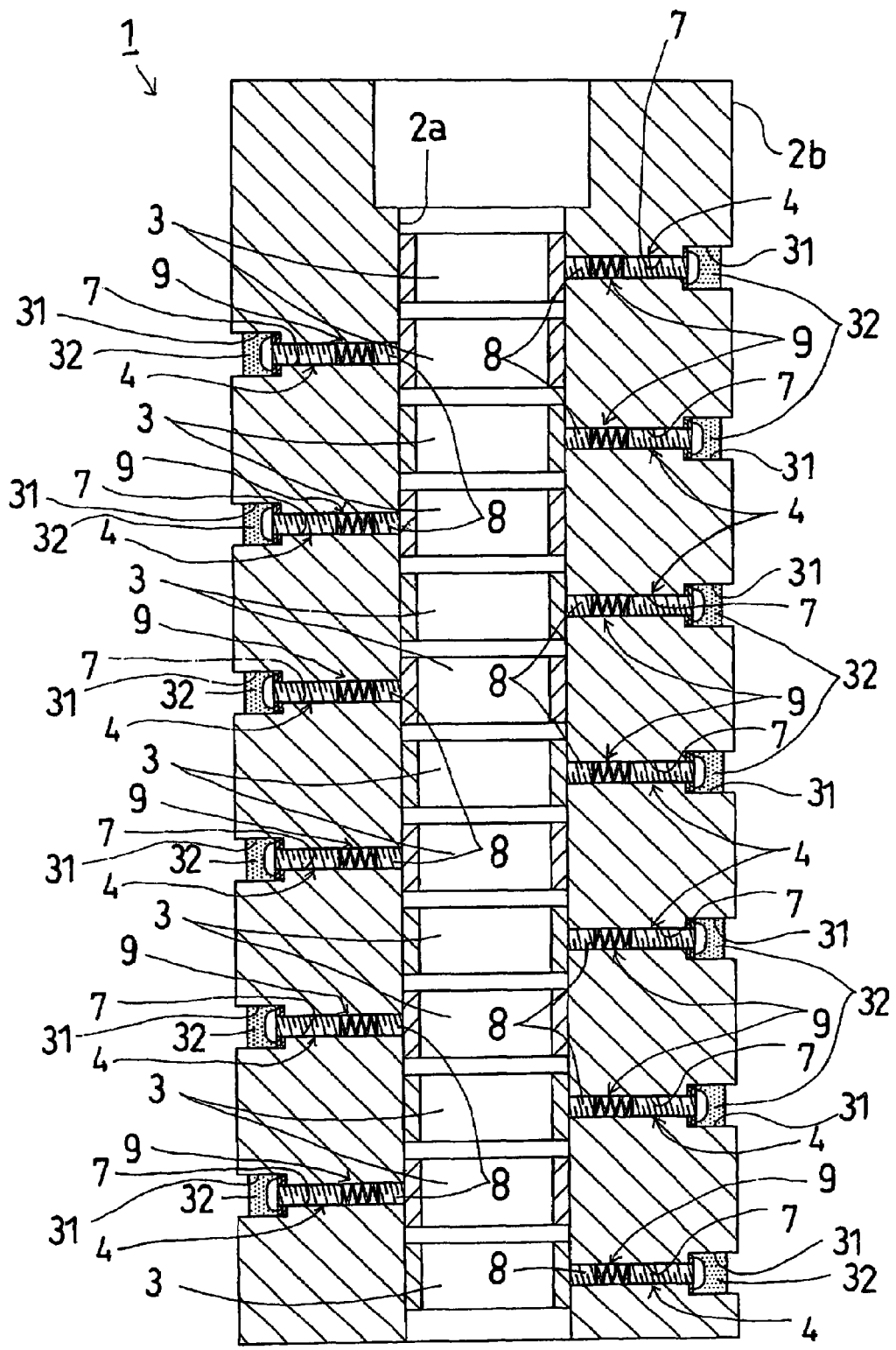
FIG. 3 is a cross sectional view taken along a line A-A in FIG. 2.

The acceleration tube main body 2 is made of a synthetic resin and has a high withstand voltage, and is formed in a cylindrical shape in which an outer diameter is about 120 mm, an inner diameter is about 40 mm, a thickness is about 40 mm and a length is about 300 mm, as shown in FIGS. 2 and 3. The synthetic resin forming the acceleration tube main body 2 includes polytetrafluoroethylene (PTFE, for example, Teflon (trade name)), polyethylene (PE), polypropylene (PP), polystyrene (PS). In the present embodiment, an inner diameter of an upper portion of the acceleration tube main body 2 is set to about 52 mm to be larger than an inner diameter of the other portions. However, it is not limited to this, and the inner diameter of the acceleration tube main body 2 may be uniform from an upper portion to a lower portion. As mentioned above, the inner diameter, the outer diameter, the thickness, the length and the like of the acceleration tube main body 2 can be appropriately modified as necessary.

The acceleration electrode 3 is formed in a ring shape in such a manner as to be closely attached to an inner peripheral surface 2a of the acceleration tube main body 2, as shown in FIGS. 2 and 3. A plurality of acceleration electrodes 3 are provided on the inner peripheral surface 2a of the acceleration tube main body 2, as shown in FIG. 3, in such a manner as to form a line in an axial direction of the acceleration tube main body 2 at a predetermined interval.

Figure 4:
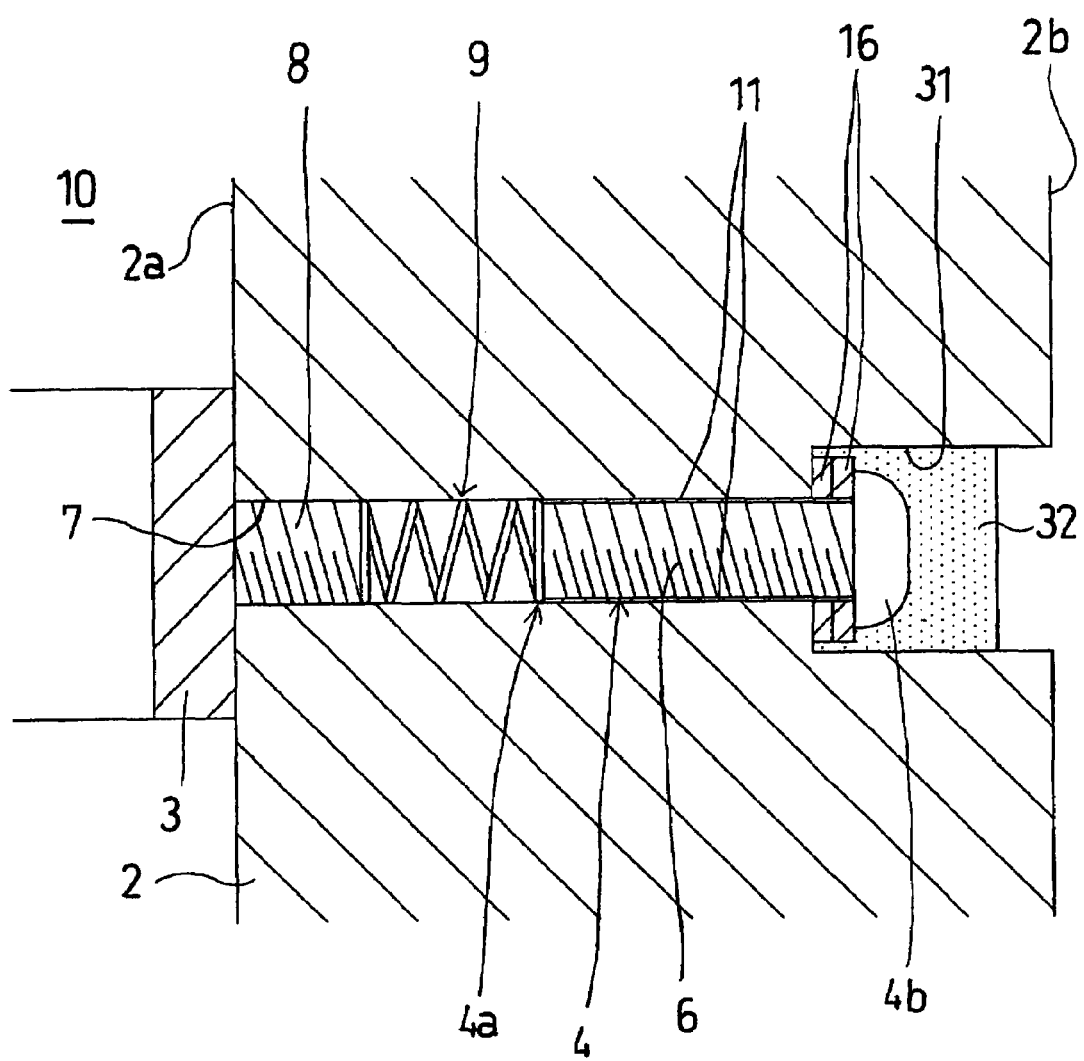
FIG. 4 is an enlarged cross sectional view of an essential part near a terminal bolt.
Figure 5:
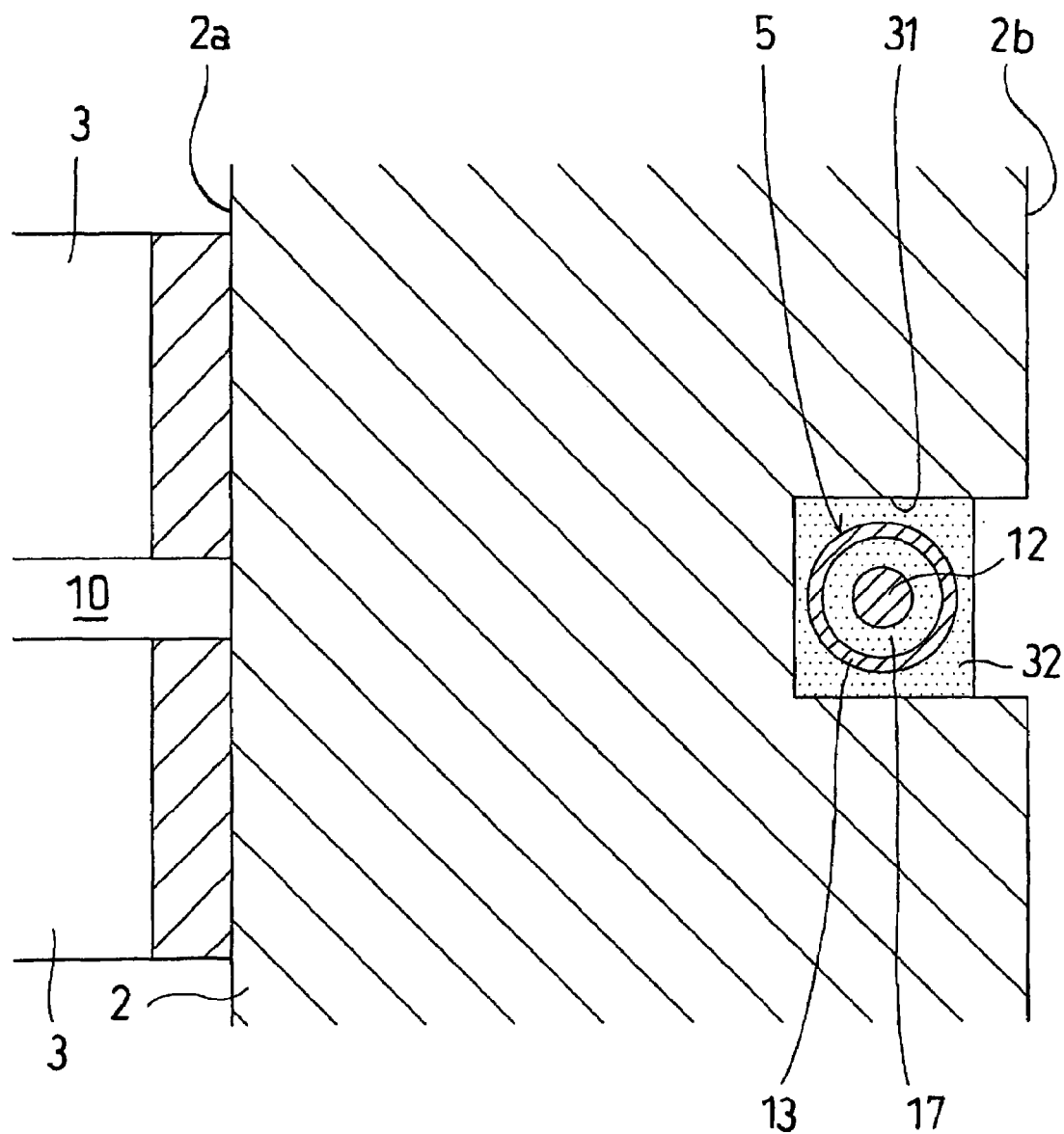
FIG. 5 is an enlarged cross sectional view of an essential part taken along a line B-B in FIG. 2.

A male thread portion 6 of the terminal bolt 4 is screwed from outside into each of bolt holes 7 formed in the acceleration tube main body 2 to penetrate in the radial direction, as shown in FIGS. 2 to 4. In this case, a female thread (not shown) with which the male thread portion 6 of the terminal bolt 4 is engaged is formed in a predetermined range around the terminal bolt 4 of the bolt hole 7.

A leading end (a front end) 4a of the terminal bolt 4 is electrically connected to the acceleration electrode 3 via an embedded bolt (a so-called hollow set screw) spacer) 8 inserted into the bolt hole 7 and a coil spring (a spring member) 9. In this case, the female thread is not formed around the embedded bolt 8 in the bolt hole 7.

Since the coil spring 9 is inserted between the leading end 4a of the terminal bolt 4 and the embedded bolt 8 in a compressed state, the embedded bolt 8 is energized in such a manner as to be brought into pressure contact with the outer peripheral surface of the acceleration electrode 3. As mentioned above, when the coil spring 9 is interposed between the terminal bolt 4 and the acceleration electrode 3, there is an advantage that the acceleration electrode 3 can be firmly supported. Further, when the embedded bolt 8 is interposed between the coil spring 9 and the acceleration electrode 3, it is possible to use the smaller coil spring 9, so that there is an advantage that a cost reduction can be achieved. In this case, the spring member may be a plate spring, a volute spring, a spiral spring or the like, in addition to the coil spring 9. The spacer may be a metal round bar or the like, in addition to the embedded bolt 8.

In this case, it is preferable that the terminal bolt 4 is closely attached to the acceleration tube main body 2 in such a manner as to set an internal space 10 of the acceleration tube main body 2 in a high vacuum condition. When the terminal bolt 4 is closely attached to the acceleration tube main body 2 via a sealing adhesive agent 11, as shown in FIG. 4, there is obtained an advantage that it is possible to securely seal between the acceleration tube main body 2 and the terminal bolt 4.

Figure 7:
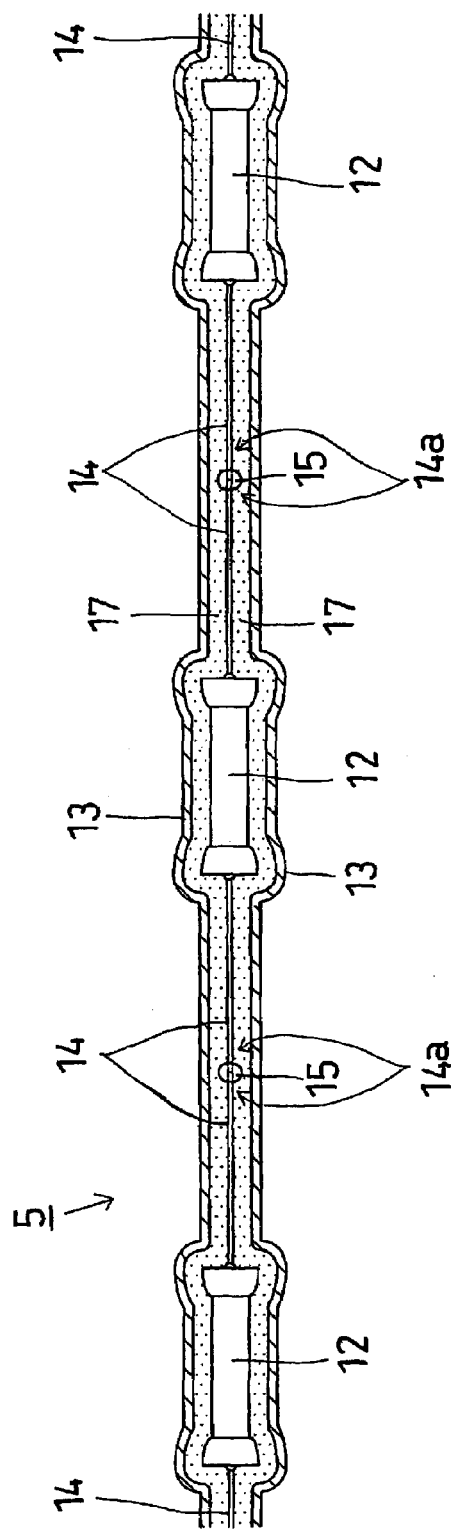
FIG. 7 is an enlarged cross sectional view of an essential part of a voltage division resistor.

The voltage division resistor 5 is structured, as shown in FIG. 7, such that a plurality of resistors 12 are connected in series, and the plurality of resistors 12 are covered with an insulating heat shrinkable tube 13 extending in the connecting direction.

The resistor 12 includes, for example, a resin coat type carbon film resistor whose surface is coated by a synthetic resin, a resin coat type metal oxide film resistor, and a resin mold type carbon mixture resistor whose front surface is coated by a mixture of a carbon powder and a synthetic resin. In order to connect the plurality of resistors 12 in series, leading ends 14a of leads 14 provided at the end portions in a longitudinal direction of the respective resistors 12 are joined to each other by a jointing material 15 such as a solder (a white lead).

Figure 8:
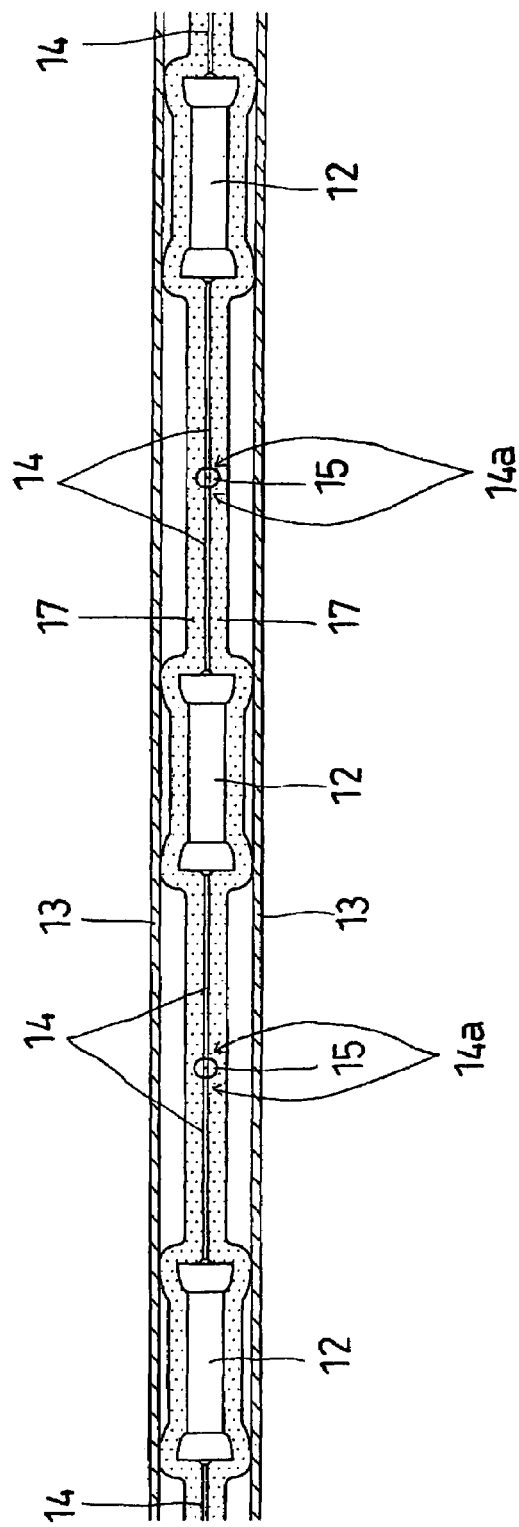
FIG. 8 is an enlarged cross sectional view of an essential part showing a state in which a plurality of resistors coated by an insulating gel are inserted into an insulating heat shrinkable tube.

The insulating heat shrinkable tube 13 is formed by polytetrafluoroethylene (PTFE, for example, Teflon (trade name)), polyethylene (PE) or the like. In order to cover the plurality of resistors 12 by the insulating heat shrinkable tube 13, the plurality of resistors 12 connected in series are inserted into the cylindrically formed insulating heat shrinkable tube 13, as shown in FIG. 8, and the insulating heat shrinkable tube 13 is contracted by heating in such a manner as to be closely attached to the surfaces of the plurality of resistors 12, as shown in FIG. 7.

Figure 9:
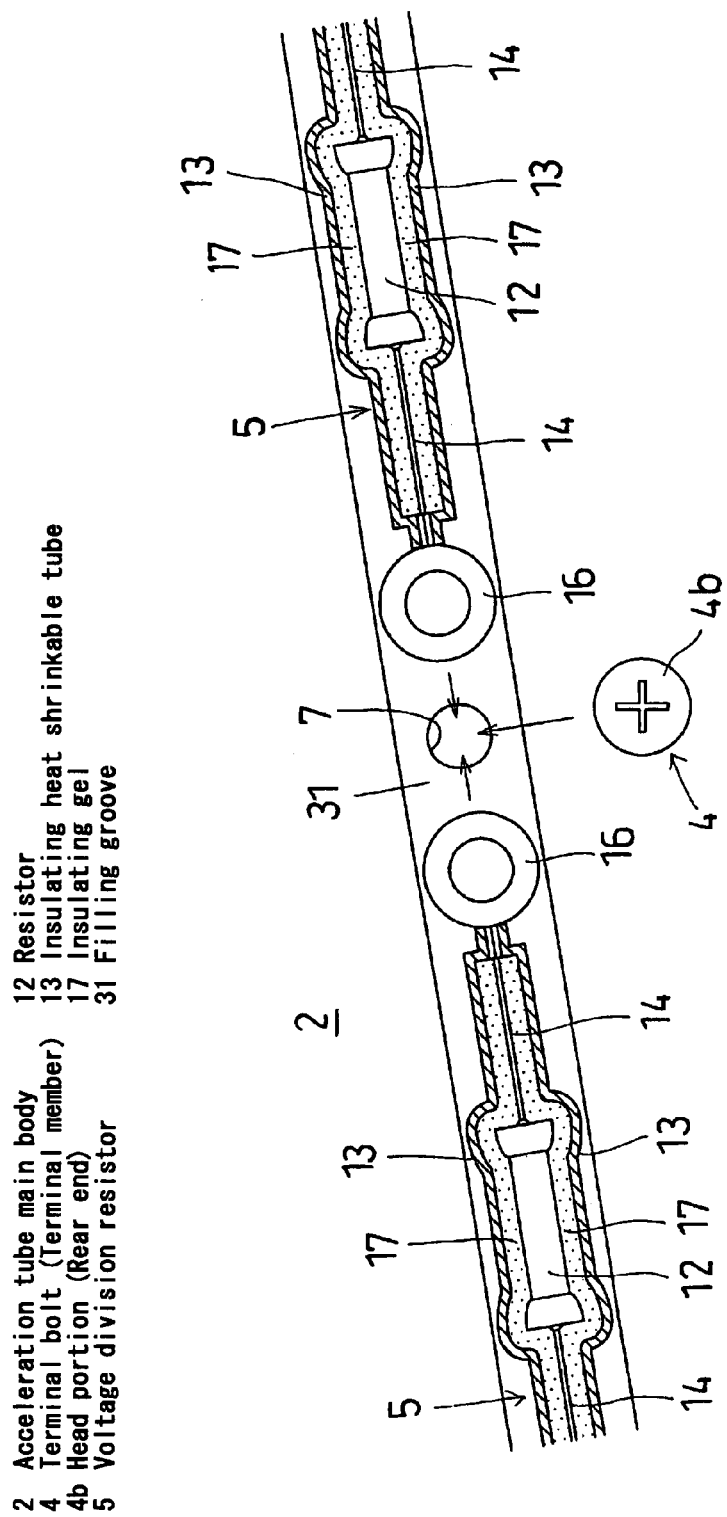
FIG. 9 is an explanatory view showing a state in which connectors provided in respective end portions of two adjacent voltage division resistors are interposed between a head portion of a terminal bolt and an acceleration tube main body in an overlapping manner.

The voltage division resistors 5 described above are wound by half periphery of a spiral in such a manner as to be spirally connected to the outer peripheral surface 2b of the acceleration tube main body 2, as shown in FIGS. 1, 4, 5 and 9. A head portion (a rear end) 4b of the terminal bolt 4 is electrically connected to each of connectors (connecting points) 16 provided at the end portions of the voltage division resistors 5. In order to electrically connect the head portion 4b of the terminal bolt 4 to the connector 16, the connector 16 is interposed between the head portion 4b of the terminal bolt 4 and the acceleration tube main body 2. In order to electrically connect the head portion 4b of the terminal bolt 4 to the connectors 16 of two adjacent voltage division resistors 5, the connectors 16 are interposed between the head portion 4b of the terminal bolt 4 and the acceleration tube main body 2 in such a manner as to be overlapped. A shape of the connector 16 may be a U-shaped form, a C-shaped form and the like, in addition to a round shape as shown in FIG. 9.

According to the voltage division resistor 5 structured as described above, since the structure itself is compact and inexpensive, there is obtained an advantage that the acceleration tube 1 can be downsized, thereby achieving a cost reduction. Further, since the plurality of resistors 12 are covered with the insulating heat shrinkable tube 13, there is obtained an advantage that it is possible to prevent the surface leak current from flowing on the surface of the resistor 12.

In this case, when the plurality of resistors 12 are coated by the insulating gel 17 and the plurality of resistors 12 are covered with the insulating heat shrinkable tube 13 via the insulating gel 17, such as in the present embodiment, there can be obtained an advantage that it is possible to more effectively prevent the surface leak current from flowing on the surface of the resistor 12. As the insulating gel 17, silicone rubber, silicone resin, polytetrafluoroethylene (PTFE, for example, Teflon (trade name)) and the like can be used. As a method of coating the plurality of resistors 12 by the insulating gel 17, a spray coating, a powder coating and the like may be employed.

Further, in the case where the coating material is not applied to the surface of the resistor 12, there is obtained an advantage that it is possible to more securely prevent the surface leak current from flowing on the surface of the resistor 12 than in the structure to which the coating material is applied.

Figure 6:
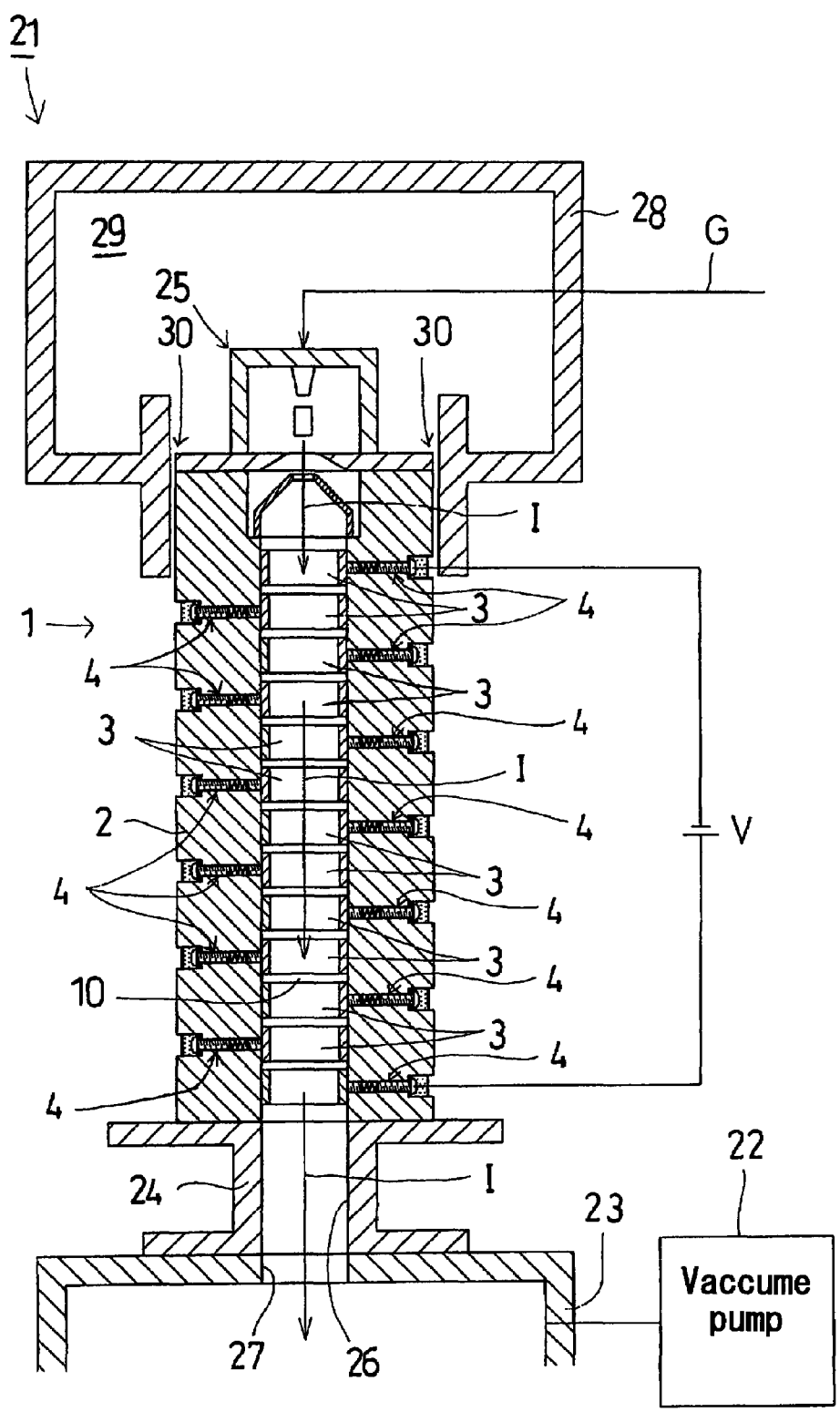
FIG. 6 is an enlarged schematic cross sectional view of an essential part showing one example of an accelerator provided with the acceleration tube.

The acceleration tube 1 structured as described above can be used in an accelerator 21 as shown in FIG. 6. The accelerator 21 is provided with a vacuum container 23 to which a vacuum pump 22 is connected, the acceleration tube 1 provided upright on the vacuum container 23 via a table member 24, and an ion source (a charged particle source) 25 provided at an upper portion of the acceleration tube 1, as shown in FIG. 6. An ion I is emitted from the ion source 25 toward a lower side of the internal space 10 of the acceleration tube main body 2 in such a manner as to coincide with the center axis thereof. The internal space 10 of the acceleration tube main body 2 is communicated with the inside of the vacuum container 23 via a communication hole 26 provided in the table member 24 and a communication hole 27 provided in the vacuum container 23, and is depressurized to a high vacuum condition by the vacuum pump 22. A raw material such as a raw material gas G is supplied to the ion source 25. As the raw material of the ion I, hydrogen (H), helium (HE), boron (B), nitrogen (N), phosphor (P), aluminum (Al) and the like may be used. Further, a cover body 28 is supported on an upper side of the acceleration tube 1 in such a manner as to cover the ion source 25. It is possible to fill an air or a withstand voltage insulating gas in the internal space 29 of the cover body 25. When the withstand voltage insulating gas is filled in the internal space 29 of the cover body 28, a gap 30 between the cover body 28 and the acceleration tube 1 is closed by an appropriate closing member. In this case, the charged particle may be an electron and the like in addition to the ion I.

An acceleration voltage V is applied to a portion between an uppermost acceleration electrode 3 and a lowest acceleration electrode 3, and is divided into the respective acceleration electrodes 3 by a plurality of voltage division resistors 5. A connector provided at an end portion of the electrode for applying the acceleration voltage V may be interposed between the head portion 4b of the uppermost terminal bolt 4 and the acceleration tube main body 2, and between the head portion 4b of the lowest terminal bolt 4 and the acceleration tube main body 2. When the internal space 10 of the acceleration tube main body 2 is set to a high vacuum state, the ion I emitted from the ion source 25 is accelerated by the application of the acceleration voltage V. The accelerated ion I enters into the vacuum container 23 through the communication hole 26 of the table member 24 and the communication hole 27 of the vacuum container 23, and can be utilized for reforming the surface of the various materials accommodated within the vacuum container 23. A value of the acceleration voltage V is not particularly limited, but some tens to about 100 kV is suitable.

As described above, when the charged particle is constituted by the ion I, that is, when the charged particle source is an ion source 25, the accelerator 21 can be used as a compact ion injection apparatus. If a solid source is attached to the ion source (the charged particle source) 25 and is sputtered by argon, it is possible to inject a p-type doping material to silicone carbide (SiC) such as boron (B) and aluminum (Al), and it is comparatively safe in exhaust of the gas. In this case, it is preferable to install a substrate or the like to inject (dope) the ion I within the vacuum container 23, and the accelerator 21 serving as the ion injecting apparatus can be utilized for manufacturing the various devices, for example, pn junction in an SiC sensor. Further, if a heater is provided in the install portion such as a substrate, it is possible to execute an ion injection at a high temperature by heating the substrate by means of the heater. Accordingly, the accelerator 21 serving as the ion injecting apparatus can be utilized for manufacturing a guard ring of a Schottky diode such as an SiC Schottky diode, in addition to the pn junction diode.

According to the acceleration tube 1 as described above, since the voltage division resistor 5 is compact and inexpensive, the downsizing can be achieved by integrally forming the voltage division resistor 5 with the cylindrical acceleration tube main body 2, and the acceleration tube main body 2 made of synthetic resin is also inexpensive, there is obtained an advantage that a cost reduction can be achieved. Further, since the acceleration tube main body 2 is made of synthetic resin and has a high insulating property, there is obtained an advantage that the length can be shortened to about two thirds of the conventional acceleration tube main body made of ceramic. Further, since the adsorption gas and the water content are not discharged in the internal space 10 of the acceleration tube main body 2 and the surface leak current does not flow even when the internal space 10 is set to the high vacuum condition, there is obtained an advantage that it is unnecessary to perform cleaning of the acceleration tube main body 2, and a service life of the acceleration tube main body 2 is long. In addition, since the voltage division resistor 5 is equipped, the insulating effect is excellent and it is possible to prevent the surface leak current from flowing. Accordingly, there is obtained an advantage that it is possible to achieve an improvement in an operation efficiency of the acceleration tube 1.

Particularly, when the accelerator 21 is used as the ion injection apparatus, the ion injection apparatus is suitable for manufacturing a trial product of a semiconductor device in a laboratory level (a research laboratory level) due to achievement of the downsizing. Further, since the ion injection apparatus is compact and inexpensive, the ion injection apparatus can be applied to the manufacturing of, for example, an ornamental article coated by the surface coating material such as metal or ceramic.

In this case, as shown in FIGS. 1, 3 to 5 and 9, when the plurality of voltage division resistors 5 are accommodated within a filling groove 31 formed in such a manner as to spirally extend on the outer peripheral surface 2b of the acceleration tube main body 2, and an insulating gel 32 is filled within the filling groove 31, there is obtained an effect that it is possible to make the acceleration tube 1 more compact and to further increase the insulating effect, and it is also possible to effectively prevent the surface leak current from flowing on the surface of the voltage division resistor 5. In this case, each of the bolt holes 7 is provided in such a manner as to communicate the internal space 10 of the acceleration tube main body 2 and the filling groove 31. As the insulating gel 32, silicone rubber, silicone resin, polytetrafluoroethylene (PTFE, for example, Teflon (trade name)) and the like can be used.

Figure 10:
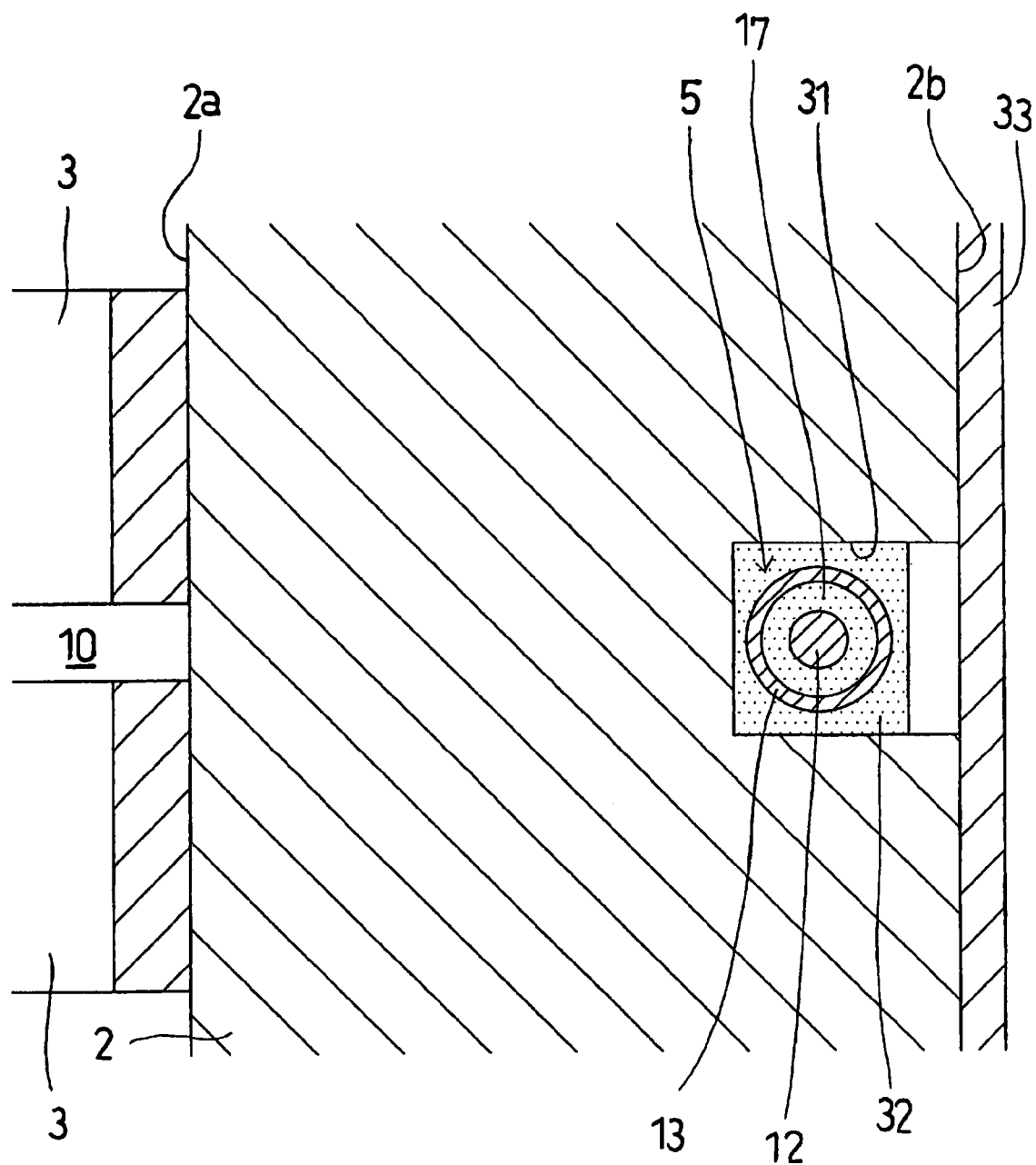
FIG. 10 is an enlarged cross sectional view showing an essential part of an example in which an outer peripheral surface of the acceleration tube main body is covered with an insulating cover.

Further, as shown in FIG. 10, if the outer peripheral surface 2b of the acceleration tube main body 2 is covered with an insulating cover 33, it is possible to shield a whole of the acceleration tube 1 from a high voltage. Accordingly, there is obtained an advantage that a user can be kept safe. As a material of the insulating cover 33, polytetrafluoroethylene (PTFE, for example, Teflon (trade name)), polyethylene (PE), polypropylene (PP), polystyrene (PS), silicone rubber, silicon resin and the like can be used.

INDUSTRIAL APPLICABILITY

As described above, the voltage division resistor for acceleration tube, the acceleration tube and the accelerator according to the present invention are suitable for achieving a cost reduction and improvement of the operation efficiency of the acceleration tube.

The invention claimed is:

1. An acceleration tube accelerating a charged particle by applying an acceleration voltage, the acceleration tube comprising:
an acceleration tube main body made of synthetic resin formed in a cylindrical shape;
a plurality of ring-shaped acceleration electrodes arranged in a line in an axial direction of said acceleration tube main body at a predetermined interval with each other on an inner peripheral surface of the acceleration tube main body;
a plurality of voltage division resistors for the acceleration tube, the plurality of voltage division resistors being spirally wound around an outer peripheral surface of said acceleration tube main body; and
a plurality of terminal members penetrating in a radial direction of said acceleration tube main body and closely attached to said acceleration tube main body, and structured such that a front end is electrically connected to said acceleration electrode and a rear end is electrically connected to each of connection points of said voltage division resistor for acceleration tube.

2. An acceleration tube according to claim 1, wherein the voltage division resistor for an acceleration tube, the voltage division resistor provided for dividing an acceleration voltage for the acceleration tube accelerating a charged particle by applying said acceleration voltage, wherein a plurality of resistors are connected in series, and the plurality of resistors are covered with an insulating heat shrinkable tube extending in the connecting direction of the resistors.

3. A voltage division resistor for acceleration tube according to claim 2, wherein said plurality of resistors are coated by an insulating gel, and said plurality of resistors are covered with said insulating heat shrinkable tube via the insulating gel.

4. A voltage division resistor for acceleration tube according to claim 2, wherein a surface of each said resistor is not coated by a coating material.

5. An acceleration tube according to claim 4, wherein said plurality of voltage division resistors for the acceleration tube are accommodated within a filling groove formed such that it extends spirally on an outer peripheral surface of said acceleration tube main body, and an insulating gel is filled within said filling groove.

6. An acceleration tube according to claim 5, wherein an outer peripheral surface of said acceleration tube main body is covered with an insulating cover.

7. An accelerator comprising the acceleration tube according to claim 6.

8. An accelerator comprising the acceleration tube according to claim 5.

9. An acceleration tube according to claim 1, wherein each said terminal member is closely attached to said acceleration tube main body via a sealing adhesive agent.

10. An accelerator comprising the acceleration tube according to claim 9.

11. An acceleration tube according to claim 1, wherein a spring member is interposed between each said acceleration electrode and each said terminal member.

12. An acceleration tube according to claim 11, wherein a spacer is interposed between said spring member and said acceleration electrode.

13. An accelerator comprising the acceleration tube according to claim 12.

14. An accelerator comprising the acceleration tube according to claim 11.

15. An accelerator comprising the acceleration tube according to claim 1.

16. An acceleration tube according to claim 1, wherein said plurality of voltage division resistors for the acceleration tube are accommodated within a filling groove formed such that it extends spirally on an outer peripheral surface of said acceleration tube main body, and an insulating gel is filled within said filling groove.

17. An acceleration tube according to claim 16, wherein an outer peripheral surface of said acceleration tube main body is covered with an insulating cover.

18. An accelerator comprising the acceleration tube according to claim 17.

19. An accelerator comprising the acceleration tube according to claim 16.

* * * * *